US009064738B2

(12) United States Patent
Van Brunt et al.

(10) Patent No.: US 9,064,738 B2
(45) Date of Patent: Jun. 23, 2015

(54) METHODS OF FORMING JUNCTION TERMINATION EXTENSION EDGE TERMINATIONS FOR HIGH POWER SEMICONDUCTOR DEVICES AND RELATED SEMICONDUCTOR DEVICES

(71) Applicant: Cree, Inc., Durham, NC (US)

(72) Inventors: Edward Robert Van Brunt, Raleigh, NC (US); Vipindas Pala, Morrisville, NC (US); Lin Cheng, Chapel Hill, NC (US); Anant Kumar Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/946,035

(22) Filed: Jul. 19, 2013

(65) Prior Publication Data
US 2015/0021742 A1    Jan. 22, 2015

(51) Int. Cl.
*H01L 29/06* (2006.01)
*H01L 29/872* (2006.01)
*H01L 21/66* (2006.01)
*H01L 29/16* (2006.01)

(52) U.S. Cl.
CPC .............. *H01L 22/12* (2013.01); *H01L 29/872* (2013.01); *H01L 29/0615* (2013.01); *H01L 29/0619* (2013.01); *H01L 29/0661* (2013.01); *H01L 29/1608* (2013.01)

(58) Field of Classification Search
USPC ........ 257/618; 324/204, 205; 205/775, 776.5, 205/780, 790.5; 438/17
See application file for complete search history.

(56) References Cited

U.S. PATENT DOCUMENTS

| 4,648,174 | A | | 3/1987 | Temple et al. |
| 5,977,605 | A | * | 11/1999 | Bakowsky et al. ............ 257/496 |
| 6,040,237 | A | * | 3/2000 | Bakowski et al. ............ 438/521 |
| 2009/0212301 | A1 | | 8/2009 | Zhang et al. |
| 2012/0122305 | A1 | * | 5/2012 | Zhang et al. .................. 438/526 |
| 2012/0256192 | A1 | | 10/2012 | Zhang et al. |
| 2012/0319249 | A1 | | 12/2012 | Uchida et al. |
| 2013/0020635 | A1 | | 1/2013 | Yilmaz et al. |

(Continued)

OTHER PUBLICATIONS

International Search Report and Written Opinion Corresponding to International Application No. PCT/US2014/038152; Date of Mailing: Sep. 10, 2014; 15 Pages.

(Continued)

*Primary Examiner* — Zandra Smith
*Assistant Examiner* — Lawrence Tynes, Jr.
(74) *Attorney, Agent, or Firm* — Myers Bigel Sibley & Sajovec, P.A.

(57) ABSTRACT

Methods of forming a power semiconductor device having an edge termination are provided in which the power semiconductor device that has a drift region of a first conductivity type is formed on a substrate. A junction termination extension is formed on the substrate adjacent the power semiconductor device, the junction termination extension including a plurality of junction termination zones that are doped with dopants having a second conductivity type. The junction termination zones have different effective doping concentrations. A dopant activation process is performed to activate at least some of the dopants in the junction termination zones. An electrical characteristic of the power semiconductor device is measured. Then, the junction termination extension is etched in order to reduce the effective doping concentration within the junction termination extension.

25 Claims, 7 Drawing Sheets

(56) References Cited

U.S. PATENT DOCUMENTS

| | | |
|---|---|---|
| 2013/0062620 A1 | 3/2013 | Henning et al. |
| 2013/0126885 A1 | 5/2013 | Disney et al. |
| 2013/0168700 A1* | 7/2013 | Furukawa et al. .............. 257/77 |

OTHER PUBLICATIONS

Temple, Victor A. et al. "Junction Terminal Extension for Near-Ideal Breakdown Voltage in p-n Junctions," IEEE Transactions on Electron Devices, vol. Ed.-33, No. 10, Oct. 1986.

Tantraporn, Wirojana et al., "Multiple-Zone Single-Mask Junction Termination Extension—A High-Yield Near-Ideal Breakdown Voltage Technology," IEEE Transactions on Electron Devices, vol. Ed-34, No. 10, Oct. 1997.

Veliadis, V., et al. "Process Tolerant Single Photolithography/Implantation 120-Zone Junction Termination Extension," Mat. Science Forum vols. 740-742 (2013) pp. 855-858.

Tsirimpis, T., et al. "Electrical Activation of B+-ions Implanted into 4H-SiC," Mat. Science Forum vols. 645-648 (2010) pp. 697-700.

Capano, M.A. et al. "Dopant Activation and Surface Morphology of Ion Implanted 4H- and 6H-Silicon Carbide," Journal of Electronic Materials, vol. 97, No. 4 1988.

Bolonikov, Alexander V. et al., "Junction Termination Extension Implementing Drive-In Diffusion of Boron for High-Voltage SiC Devices," IEEE Transactions on Electron Devices, vol. 57, No. 8, Aug. 2010.

* cited by examiner

METHODS OF FORMING JUNCTION TERMINATION EXTENSION EDGE TERMINATIONS FOR HIGH POWER SEMICONDUCTOR DEVICES AND RELATED SEMICONDUCTOR DEVICES

STATEMENT OF U.S. GOVERNMENT INTEREST

This invention was made with Government support under Contract No. W911NF-12-R-0012-SPECIAL-HVPT. The Government has certain rights in the invention.

FIELD OF THE INVENTION

The present invention relates to power semiconductor devices and, more particularly, to edge termination structures for power semiconductor devices and to methods of forming such edge termination structures.

BACKGROUND

Power semiconductor devices are widely used to carry large currents and support high voltages. A wide variety of power semiconductor devices are known in the art including, for example, power Metal Oxide Semiconductor Field Effect Transistors ("MOSFET"), Insulated Gate Bipolar Transistors ("IGBT"), Schottky diodes, Junction Barrier Schottky ("JBS") diodes, merged p-n Schottky ("MPS") diodes, Gate Turn-Off Transistors ("GTO"), MOS-controlled thyristors and various other devices. Modern power semiconductor devices are generally fabricated from monocrystalline silicon semiconductor material, or, more recently, from silicon carbide ("SiC"). Moreover, power semiconductor devices are often fabricated in a paralleled unit cell structure.

Power semiconductor devices can have a lateral structure or a vertical structure. In a lateral structure, the terminals of the device (e.g., the drain, gate and source terminals for a power MOSFET device) are on the same major surface (i.e., top or bottom) of a semiconductor layer structure. In contrast, in a vertical structure, terminals are provided on both major surfaces of the semiconductor layer structure (e.g., in a vertical MOSFET, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes at least two semiconductor layers in a stacked relationship or to at least a single semiconductor layer having regions that are doped with different types of dopants.

A conventional SiC power device typically has a SiC substrate such as a SiC wafer having a first conductivity type (e.g., an n-type substrate) on which an epitaxial layer having the first conductivity type (e.g., n-type) is formed. This epitaxial layer (which may comprise one or more separate layers) functions as a drift region of the power semiconductor device. The device typically includes an "active region" which includes one or more power semiconductor devices that have a p-n junction and/or a Schottky junction. The active region may be formed on and/or in the drift region. The active region acts as a main junction for blocking voltage in the reverse bias direction and providing current flow in the forward bias direction. As will be discussed below, the device has an edge termination region that is adjacent the active region. One or more power semiconductor devices may be formed on the substrate, and each power semiconductor device will typically have its own edge termination. After the substrate is fully formed and processed, the substrate may be diced to separate the individual edge-terminated power semiconductor devices. In many cases, the power semiconductor devices on the substrate will have a unit cell structure in which the active region of each power semiconductor device includes a large number of individual devices that are disposed in parallel to each other and that together function as a single power semiconductor device.

As noted above, semiconductor power devices are designed to block (in the reverse blocking state) or pass (in the forward operating state) large voltages and/or currents. For example, in the reverse blocking state, a semiconductor power device may be designed to sustain tens, hundreds or thousands of volts of electric potential, or even higher voltages. However, as the reverse voltage approaches or passes the reverse voltage level that the device is designed to block, non-trivial levels of current may begin to flow through the power semiconductor device. Such current, which is typically referred to as "leakage current," may be highly undesirable. Leakage current may begin to flow if the reverse voltage is increased beyond the design voltage blocking capability of the device, which is a function of, among other things, the doping and thickness of the drift layer. However, current leakage can occur for other reasons, such as failure of the edge termination and/or the primary junction of the device.

FIG. 1 is a log-linear graph that schematically illustrates the leakage current characteristics for a conventional SiC power JBS Schottky diode. As shown in the graph of FIG. 1, the reverse leakage current ($I_R$) of the JBS diode increases with increasing reverse voltage ($V_R$). The reverse voltage $V_R$ at which the reverse leakage current $I_R$ reaches a predetermined level $I_0$ is defined as the rated breakdown voltage ($V_{BR}$) of the device. As the reverse voltage $V_R$ on the diode is increased past the breakdown voltage $V_{BR}$ to a critical level which is referred to as the theoretical avalanche breakdown point ($V_{AV}$), the increasing electric field begins to ionize atoms within the semiconductor device, leading to a condition known as avalanche breakdown. When avalanche breakdown occurs, the reverse current increases sharply and typically becomes uncontrollable. Such failures are generally catastrophic, and may damage or destroy the device.

A conventional power semiconductor device may begin to break down and allow non-trivial amounts of leakage current to flow at a voltage that is lower than the design breakdown voltage $V_{BR}$ of the device. In particular, leakage current may begin to flow at the edges of the active region, where high electric fields may be experienced due to electric field crowding effects. In order to reduce this electric field crowding (and the resulting increased leakage currents), edge termination structures are provided that surround part or all of the active region of a power semiconductor device. These edge terminations may spread the electric field out over a greater area, thereby reducing the electric field crowding. One known type of edge termination is a junction termination extension ("JTE").

A JTE edge termination typically surrounds the active region of a power semiconductor device, and may include a plurality of "zones" that have a conductivity type that is opposite the conductivity type of the drift region of the device (e.g., a p-type region with respect to the example SiC power device discussed above). The JTE zones are typically formed by ion implantation, although they can also be formed in other ways (e.g., by growing doped layers, by diffusion, etc.). In SiC power devices having p-type JTE zones, the implanted dopants used to form the JTE zones may be aluminum, boron, or any other suitable p-type dopant. The implanted dopants of the opposite conductivity type spread the electrical field in the reverse blocking state over a greater distance (as compared to a device without a JTE edge termination). Consequently, the JTE edge termination may reduce or prevent the electric field crowding at the edges of the active region, and may also reduce or prevent the depletion region from interacting with the surface of the device. Surface effects may cause the depletion region to spread unevenly, which may adversely affect the breakdown voltage of the device. While a JTE edge termination is one known type of edge termination, other edge termination techniques are also known in the art including, for example, guard rings.

A conventional JTE-terminated Schottky power diode 10 is illustrated in FIG. 2. It will be appreciated that FIG. 2 and the various other cross-sectional diagrams included in this application only illustrates one half of the power semiconductor device structure in order to simplify the drawings; the structure may include mirror image portions (not shown). As shown in FIG. 2, the JTE edge terminated Schottky diode 10 includes an n− drift layer 22 on an n+ substrate 24. The substrate 24 may comprise, for example, an n+ SiC wafer. However, any suitable substrate may be used. The substrate 24 may be optional (e.g., it can be removed after device formation). The drift layer 22 may comprise an epitaxially-grown n− SiC drift layer. At least one p+ region 26 is formed, typically by ion implantation, in an upper surface of the n− drift layer 22. These p+ regions 26 form respective p-n junctions with the drift layer 22. A metal anode Schottky contact 29 is on the drift layer 22 and may be in contact with both the n− drift layer 22 and the p+ region(s) 26. The anode contact 29 forms a Schottky junction with the exposed portions of the drift layer 22, and may form an ohmic contact with the p+ region(s) 26. A metal cathode contact 28 is formed on the opposite side of the n+ substrate 24. The p+ regions 26, the Schottky contact 29, the drift layer 22, the substrate 24 and the cathode contact 28 comprise a Schottky diode that is formed in an active region 20.

In forward operation, a junction J1 between the metal anode Schottky contact 29 and the drift layer 22 turns on before the junctions J2 between the p+ regions 26 and the drift layer 22. Thus, at low forward voltages, the device exhibits Schottky diode behavior. That is, current transport in the device is dominated by majority carriers (electrons) injected across the Schottky junction J1 at low forward voltages. Under reverse bias conditions, however, the depletion regions formed by the p-n junctions J2 between the p+ regions 26 and the drift layer 22 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 22 and the design of any edge termination.

Referring again to FIG. 2, the Schottky power diode 10 further includes a JTE edge termination 30 that includes a plurality of JTE zones 32A, 32B, 32C that are provided in the n− drift layer 22 adjacent to the p+ regions 26. The JTE zones 32A, 32B, 32C are p-type regions that may have levels of charge that decrease outwardly in a stepwise fashion with distance from the active region 20. Although three JTE zones 32A, 32B, 32C are illustrated, more or fewer JTE zones 32 may be provided.

The JTE zones 32A, 32B, 32C may be formed by implantation of ions into the n− drift layer 22. However, since the JTE zones 32A, 32B, 32C have different levels of p-type dopants, such implantation may require multiple mask and implantation steps, increasing the complexity and expense of production. This may be exacerbated as the number of JTE zones 32 is increased.

SUMMARY

Pursuant to embodiments of the present invention, methods of forming a power semiconductor devices having edge terminations are provided in which a power semiconductor device is formed on a substrate. A junction termination extension is formed on the substrate adjacent the power semiconductor device, the junction termination extension including a plurality of junction termination zones that are doped with dopants such that the junction termination zones have different effective doping concentrations. A dopant activation process such as an ion implantation anneal is performed to activate at least some of the dopants in the junction termination zones. An electrical characteristic of the power semiconductor device such as, for example, a leakage current, is measured. Then, the junction termination extension is etched in order to reduce the effective doping concentration of dopants within the junction termination extension.

In some embodiments, the power semiconductor device has a drift region that has a first conductivity type and the junction termination zones are doped with dopants having a second conductivity type that is different than the first conductivity type. The power semiconductor device may be a first of a plurality of power semiconductor devices that are formed on the substrate, and an electrical characteristic of the first of the plurality of semiconductor devices or of a second of the plurality of power semiconductor devices may be measured after the etching of the junction termination extension is completed.

In some embodiments, at least some of the junction termination zones comprise an implanted region in a top surface of the drift region that is adjacent to a non-implanted region in the top surface of the drift region. In such embodiments, the effective doping concentration of each junction termination zone may be greater than the effective doping concentration of others of the junction termination zones that are a greater distance from the power semiconductor device. The size of the implanted region of each junction termination zone may be based on a distance of the junction termination zone from the power semiconductor device so that the size of the implanted region of each junction termination zone exceeds the sizes of the implanted regions of others of the junction termination zones that are at a greater distance from the power semiconductor device.

The junction termination extension may initially be formed by doping the junction termination zones with effective doping concentrations that exceed target effective doping concentrations. The etching of the junction termination extension may be performed in some embodiments by etching both the implanted region and any non-implanted region of each junction termination zone, while in other embodiments the etching may be performed by only etching the implanted regions of each junction termination zone.

Pursuant to further embodiments of the present invention, methods of forming an edge termination are provided in which a junction termination extension is formed on a substrate that includes a semiconductor layer thereon. A first probing operation is performed on the substrate with the semiconductor layer to measure an electrical characteristic thereof. At least a portion of the junction termination extension is then removed. Them a second probing operation is performed on the substrate with the semiconductor layer.

In some embodiments, the first probing operation and the second probing operation measure the same electrical characteristic. The electrical characteristic may be, for example, a breakdown voltage or a leakage current. The junction termination extension may include a plurality of junction termination zones, and removing at least a portion of the junction termination extension may comprise etching an upper surface of at least a portion of each junction termination zone. The semiconductor layer may have a first conductivity type and forming the junction termination extension may comprise implanting dopants having a second conductivity type into the semiconductor layer to form a plurality of implanted regions, where each junction termination zone comprises one of the implanted regions and at least some of the junction termination zones include a non-implanted region that is adjacent the implanted region of the junction termination zone. The removal of at least a portion of the junction termination extension may be accomplished, for example, by etching the junction termination zones to reduce the number of activated dopants in each junction termination zone by approximately the same percentage.

Pursuant to still further embodiments of the present invention, methods of forming power semiconductor devices are provided in which first and second power semiconductor devices are formed on a substrate that has a semiconductor layer that has a first conductivity type thereon. First and second junction termination extensions are formed on the substrate adjacent the first power semiconductor device, each of which include a plurality of junction termination zones that are doped with dopants having a second conductivity type, where the junction termination zones have different effective doping concentrations. A dopant activation process is performed to activate at least some of the dopants in the junction termination zones. An electrical characteristic of the first power semiconductor device is measured. The number of activated dopants having the second conductivity type in the first and second junction termination extensions is then reduced after measuring the electrical characteristic of the first power semiconductor device. Then, the electrical characteristic of at least one of the first power semiconductor device or the second power semiconductor device is measured.

Pursuant to yet additional embodiments of the present invention, power semiconductor devices are provided that include a semiconductor layer having a first conductivity type. These devices have an active region that includes at least one power device that is formed in a semiconductor layer structure that includes at least a semiconductor layer having a first conductivity type and a region in an upper surface of the semiconductor layer that has a second conductivity type. These devices also include a junction termination extension that is adjacent to the active region and that includes a plurality of junction termination zones in the semiconductor layer, where each junction termination zone comprises a junction termination region having the second conductivity type. A top surface of at least portions of some of the junction termination zones are recessed below a top surface of the semiconductor layer structure in the active region but are above a bottom surface of the region in the upper surface of the semiconductor layer that has a second conductivity type.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
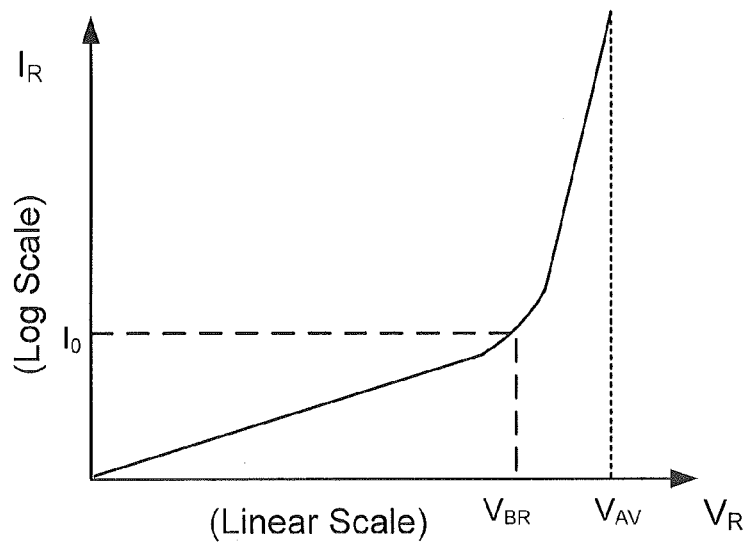
FIG. 1 is a log-linear graph illustrating the leakage current characteristics for a conventional SiC power JBS Schottky diode.
Figure 2:
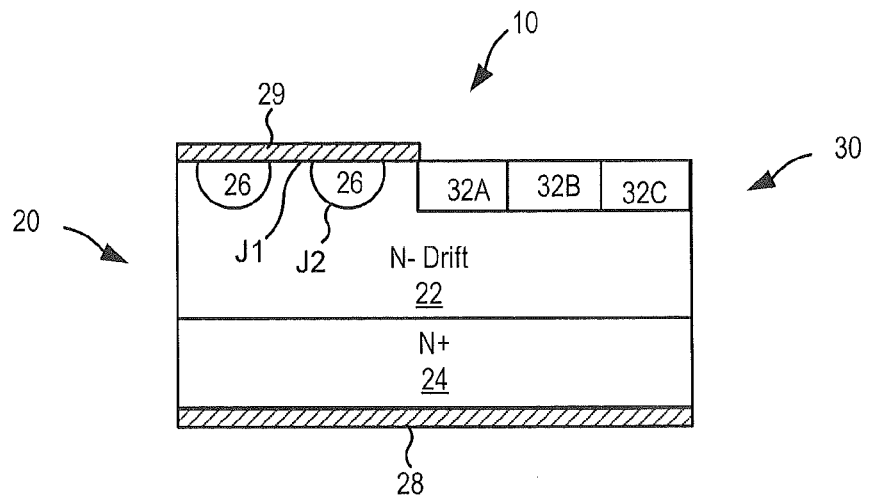
FIG. 2 is a schematic cross-sectional view of a portion of a conventional power Schottky diode having a JTE edge termination.

As noted above, in a power semiconductor device that includes a JTE edge termination, the amount of implanted charges is gradually decreased with increasing distance from the active region. In the example of FIG. 2 above, this decreasing charge density with increasing distance from the active region is accomplished by performing multiple implants of p-type dopants into the power semiconductor device using multiple masking steps to form a plurality of JTE zones 32, where the JTE zones 32 have decreasing amounts of p-type dopants the farther away that they are from the active region. The use of multiple mask formation and ion implantation steps can increase the cost and complexity of the fabrication process.

Figure 3:
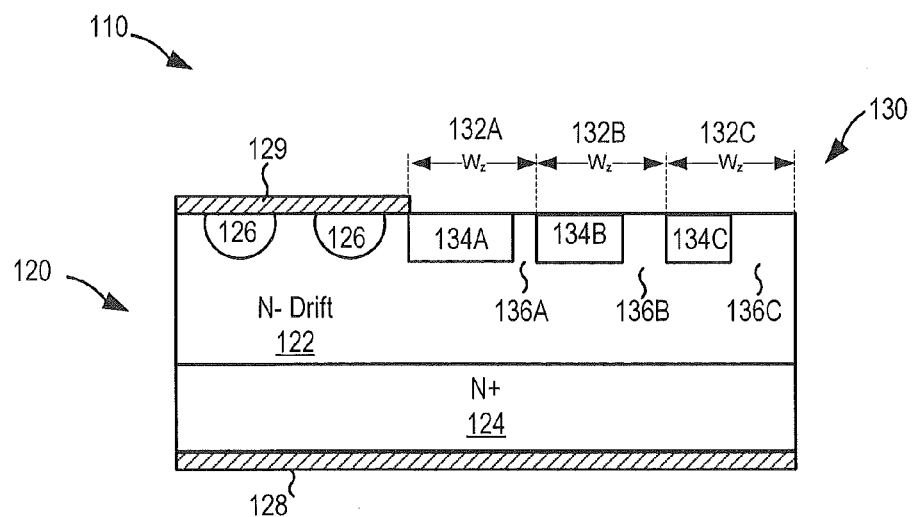
FIG. 3 is a cross-sectional view of a portion of another conventional Schottky diode having a JTE edge termination that may be formed using a single mask.

FIG. 3 illustrates another conventional edge terminated Schottky diode 110 that includes a JTE edge termination that may be formed using a single mask. The edge terminated Schottky diode 110 includes an active region 120 and a JTE region 130. The edge terminated Schottky diode 110 includes an n− drift layer 122 that is on an n+ substrate 124. A plurality of p+ regions 126 are formed, typically by ion implantation, in an upper surface of the n− drift layer 122. A metal anode Schottky contact 129 is formed on the drift layer 122 in contact with both the n− drift layer 122 and the p+ regions 126. A cathode contact 128 is formed on the opposite side of the n+ substrate 124. The JTE region 130 includes a plurality of JTE zones 132A, 132B, 132C that are formed in the n− drift layer 122 adjacent to the p+ regions 126. JTE zone 132A includes a p-type region 134A and an n-type region 136A (although the n-type region 136A may be omitted in some embodiments). JTE zone 132B includes a p-type region 134B and an n-type region 136B. JTE zone 132C includes a p-type region 134C and an n-type region 136C. The p-type regions 134A, 134B, 134C of JTE zones 130A, 130B, 130C may be formed in a single ion implantation step in which the active region 120 and the n-type regions 136A, 136B, 136C of the n− drift layer 122 are covered by a mask while p-type regions 134A, 134B, 134C of the n− drift layer 122 (which prior to the ion implantation step are n-type regions) are exposed by the mask, and then p-type dopants are implanted into the regions of the n− drift layer that are exposed by the openings in the mask to form the p-type regions 134A, 134B, 134C.

Each of the p-type regions 134A, 134B, 134C may have approximately the same density of p-type dopants implanted therein as these regions are formed by the same ion implantation step. However, p-type region 134A is larger than is p-type region 134B, and p-type region 134B is larger than p-type region 134C. As the JTE zones 132A, 132B, 132C are each the same size, this means that the n-type region 136A is smaller than the n-type region 136B, and n-type region 136B is smaller than n-type region 136C.

Since the p-type region 134A is larger than the p-type region 134B, JTE zone 132A will have a higher concentration of p-type dopants as compared to JTE zone 132B. Likewise, since the p-type region 134B is larger than the p-type region 134C, JTE zone 132B will have a higher concentration of p-type dopants as compared to JTE zone 132C. Herein, the doping concentration of JTE zones will typically be referred to by reference to the "effective doping concentration" of the JTE zone, which is the number of opposite conductivity type dopants included in the JTE zone divided by the volume of JTE zone (including both the opposite conductivity type region and any same conductivity type region of the JTE zone). The "opposite conductivity type" dopant region of a JTE zone refers to that part of the JTE zone that is doped with dopants having a conductivity type that is opposite to the conductivity type of the drift layer of the device (e.g., region 134A of JTE zone 132A in FIG. 3), while the "same conductivity type" dopant region of a JTE zone refers to any part of the JTE zone that is doped with dopants having the same conductivity type as the conductivity type of the drift layer of the device (e.g., region 136A of JTE zone 132A in FIG. 3). Thus, it will be appreciated that in the device of FIG. 3 the effective doping concentration of the JTE zones 132 decreases with the distance of the JTE zones 132 from the active region 120. Consequently, FIG. 3 illustrates a power semiconductor device 110 that has a JTE edge termination that may be formed using a single ion implantation step that has JTE zones having opposite conductivity type dopant concentrations that decrease in a step-wise fashion with increasing distance from the active region 120. As ion implantation steps may tend to be time consuming and costly, the single-mask implant step that is used to form the power semiconductor device 110 of FIG. 3 may be preferred over the multiple-mask implant process used to form the power semiconductor device 10 of FIG. 2.

The amount of activated p-type dopants that are present in the p-type regions 134A, 134B, 134C of JTE zones 132A, 132B, 132C may be a critical parameter in certain applications. For example, for many power semiconductor devices, the JTE edge termination design can function acceptably so long as the number of activated opposite conductivity type dopants in each of the JTE zones is within about a factor of two from a desired level of activated opposite conductivity type dopants (e.g., a well-designed JTE edge termination with an optimal dose of activated opposite conductivity type dopants of $2 \times 10^{13}$ cm$^{-2}$ in a particular JTE zone would still function acceptably so long as the actual level of activated opposite conductivity type dopants in that JTE zone was between about $1 \times 10^{13}$ cm$^{-2}$ and about $4 \times 10^{13}$ cm$^{-2}$). Typically, the number of opposite conductivity type dopants that are implanted into each JTE zone may be controlled with a high degree of precision. However, with respect to ion implanted dopants into, for example, 4H—SiC, the amount of p opposite conductivity type dopants that are activated can vary by significantly more than a factor of two. This is particularly true when one or more of the processing parameters are changed between fabrication runs.

Figure 4:
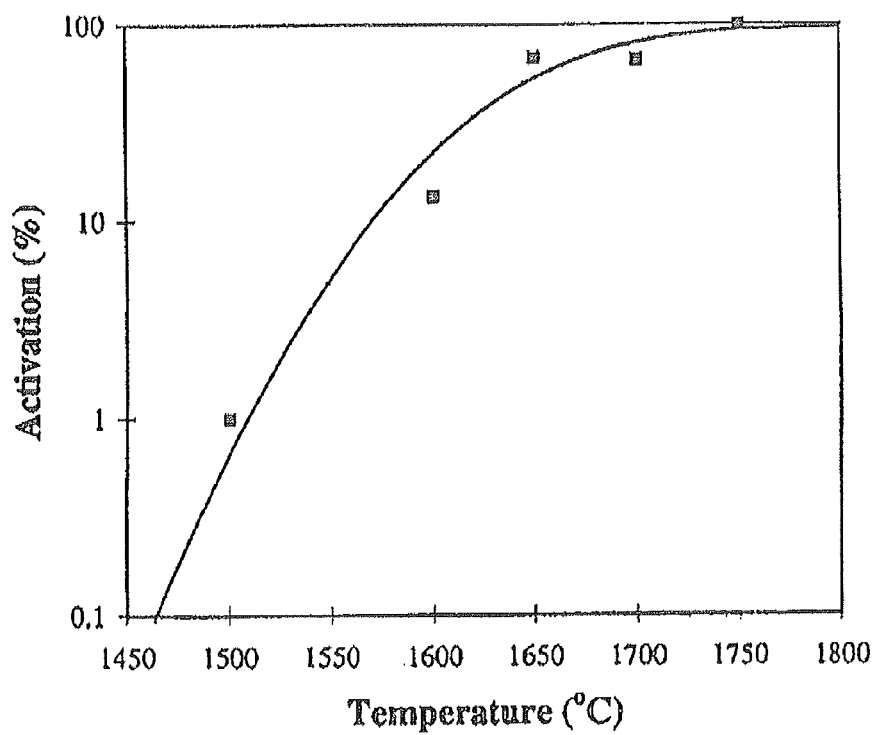
FIG. 4 is a graph of the activated fraction of implanted boron as a function of annealing temperature in 4H—SiC.
Figure 5:
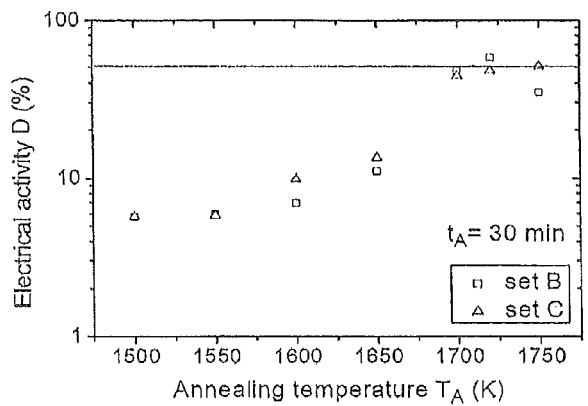
FIG. 5 is a graph of the electrical activity of implanted boron as a function of annealing temperature for two different wafers that were processed under the same conditions.

For example, boron is routinely used as a p-type dopant in 4H—SiC because of its favorable diffusion properties. However, as shown in FIG. 4, which is a graph of the activated fraction of implanted boron versus annealing temperature in 4H—SiC, the percentage of boron atoms that may be activated by an activation annealing step can vary from between 0% and 100% depending upon annealing temperature. Moreover, as the annealing temperature is increased, the variation in the electrical activity of the dopants may increase. For example, FIG. 5 is a graph of the electrical activity of implanted boron versus anneal temperature for two different wafers that were processed under the same conditions. As shown in FIG. 5, even under constant processing conditions, the electrical activity can vary significantly between processing runs, particularly at higher temperature anneals (note that FIG. 5 is plotted on a log scale, and hence illustrates that variations of a factor of two can be expected even when processing conditions are held constant). As FIG. 4 illustrates that higher annealing temperatures are necessary to achieve high dopant activation levels, FIGS. 4 and 5 illustrate how variations in the electrical activity of boron implanted 4H—SiC may easily exceed a factor of two.

Because of the above-described variations in electrical activity in, for example, boron implanted 4H—SiC, it may be necessary to perform one or more calibration runs when fabricating power semiconductor devices having JTE terminations in order to determine implant dosages for the p-type dopants that are implanted into the JTE zones. However, the use of such calibration runs can be both expensive and time-consuming, as they may require complete fabrication and testing of one or more calibration wafers.

Pursuant to embodiments of the present invention, methods of adjusting the amount of activated dopants in the JTE zones of a JTE edge termination are provided which can be performed on a production run wafer or a test wafer while reducing or eliminating the need for any calibration wafers. The methods disclosed herein may be performed after the activation step that is used to activate the implanted dopants in the JTE zones (e.g., the activation anneal) in the wafer fabrication process. In-process wafer probing is used to measure an electrical characteristic of one or more power semiconductor devices on the wafer such as, for example, the leakage current through the JTE zones and/or the breakdown voltage level of the device(s). The wafer may then be processed to vary the level of activated dopants in the JTE zones in a desired fashion and the in-process probing may be repeated to obtain additional feedback. This sequence of steps may be repeated until it is determined, for example, that the power semiconductor devices on the wafer have met a desired design parameter such as, for example, a minimum desired breakdown voltage. The methods according to embodiments of the present invention may be performed on, for example, wafers fabricated using either multiple-mask, multiple zone JTE edge terminations or single-mask, multiple-zone JTE edge terminations.

Embodiments of the present invention will now be described in greater detail with reference to the remaining figures, which disclose example embodiments.

Figure 6:
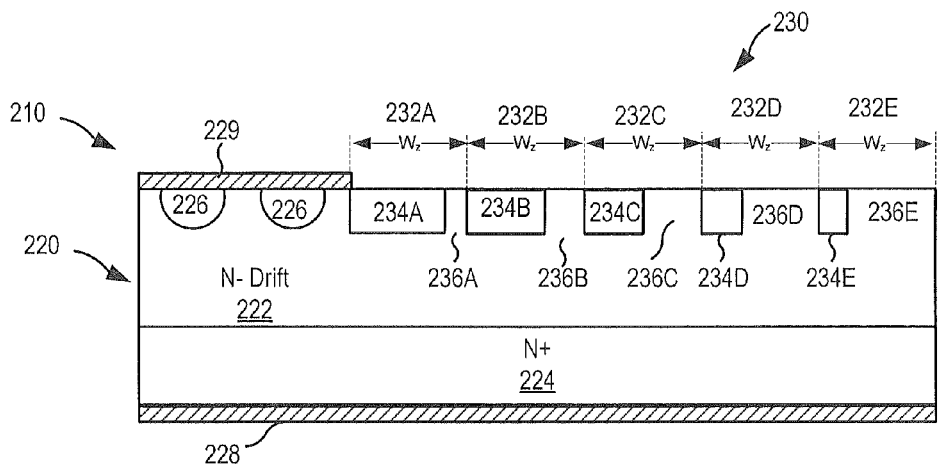
FIGS. 6-9 are schematic cross-sectional and plan views that illustrate methods of fabricating a power semiconductor device according to embodiments of the present invention.
Figure 7:
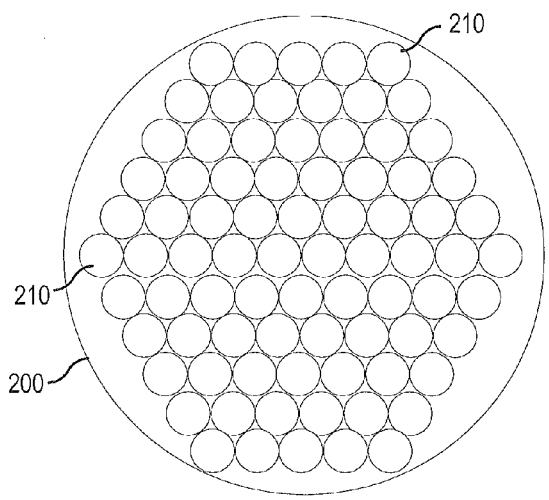
Figure 8:
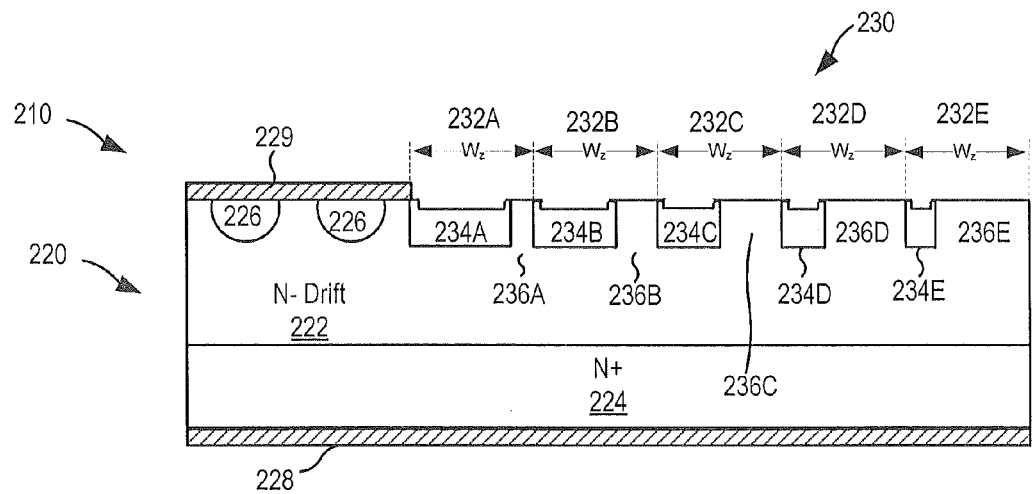
Figure 9:
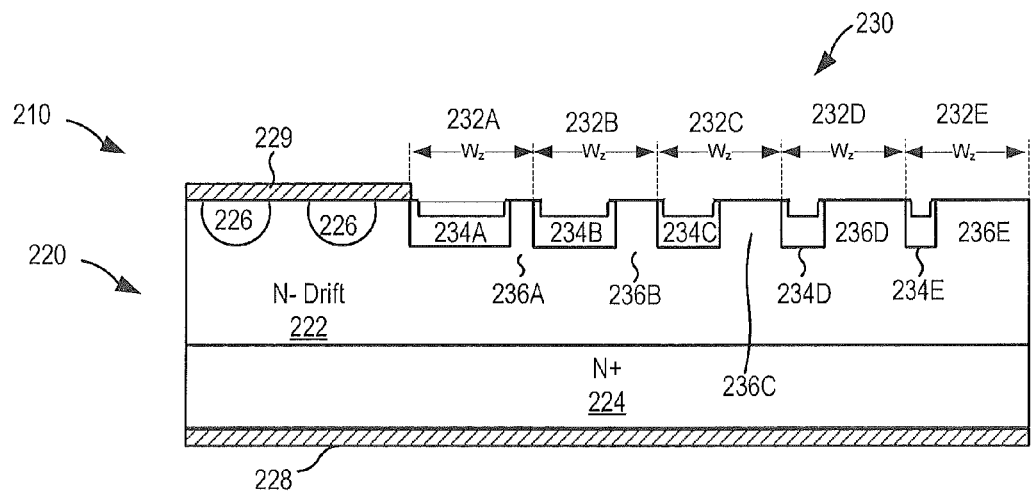

FIGS. 6-9 illustrate a method of fabricating a power semiconductor device having a JTE edge termination according to certain embodiments of the present invention. In particular, FIGS. 6 and 8-9 are schematic cross-sectional views that illustrate various steps in the fabrication process for the power semiconductor device, while FIG. 7 is a schematic plan view of a wafer that includes a plurality of the power semiconductor devices that are depicted in FIGS. 6, 8 and 9.

Referring first to FIG. 6, a portion of a power semiconductor device 210 (e.g., a SiC JBS diode) is illustrated that has an active region 220 and a JTE edge termination 230. The power semiconductor device 210 includes a substrate 224 which may comprise, for example, a heavily doped n-type (n+) 4H—SiC substrate. It will be appreciated that in some embodiments the substrate 224 may be removed after device formation, if desired. A lightly-doped (n−) 4H—SiC drift layer 222 may be formed on the substrate 224 by, for example, epitaxial growth. Both the substrate 224 and the drift layer 222 may extend throughout both the active region 220 and the JTE edge termination region 230. One or more heavily-doped p+ regions 226 are formed, typically by ion implantation, in an upper surface of the n− drift layer 222 in the active region 220 of the substrate 224. A metal anode Schottky contact 229 is formed on the drift layer 222 in contact with both the n− drift layer 222 and the p+ regions 226. A bottom-side metal contact 228 may be provided on the opposite side of the substrate 224.

As is further shown in FIG. 6, the JTE region 230 includes a plurality of JTE zones 232A, 232B, 232C, 232D, 232E. The JTE zones 232 may be formed using a single ion implantation mask using the above-described single-mask, multiple zone JTE zone formation technique that is discussed above with reference to FIG. 3. The JTE zones 232 are formed in an upper portion of the n− drift layer 222. The first JTE zone 232A may be, for example, adjacent to the p+ regions 226, and the remaining JTE zones 232B through 232E may be arranged outwardly therefrom.

Each JTE zone 232 includes an implanted region 234 and a non-implanted region 236. Thus, for example, JTE zone 232B includes an implanted region 234B and a non-implanted region 236B. The implanted regions are implanted with p-type dopants. The non-implanted regions comprise n-type regions. The size of the implanted regions 234 become increasingly smaller with increasing distance from the active region 220 such that the size of implanted region 234A is greater than the size of implanted region 234B, which in turn is larger than implanted region 234C, etc. As described above, the implanted regions 234A, 234B, 234C, 234D, 234E may each be implanted with the same dosage of p-type dopants using a single ion implantation step. Since the size of the implanted regions 234 decrease with increasing distance from the active region 220, the JTE edge termination 230 will effectively exhibit a step-wise gradually decreasing dopant profile since the JTE zones 232 will have a decreasing effective dopant concentration.

FIG. 7 is a schematic plan view of a semiconductor wafer that includes the power semiconductor device 210. As shown in FIG. 7, the power semiconductor device 210 can comprise one region of a semiconductor wafer 200. The semiconductor wafer 200 may include, for example, tens, hundreds or thousands of power semiconductor devices 210. Each power semiconductor device 210 on wafer 200 may include a single power semiconductor device in the active region 220 or may include a plurality of unit cell power semiconductor devices in the active region 220 that are implemented in parallel. Each power semiconductor device 210 may be a planar device in that the top surface of the semiconductor layers is generally planar (note that contact 229 comprises a metal layer that is selectively formed on the semiconductor layers in the active region 220).

The power semiconductor devices 210 may be fabricated using conventional methods. The implant dosage for the JTE edge termination 230 may be selected to achieve a minimum doping concentration in the JTE zones 232A, 232B, 232C, 232D, 232E. This minimum doping concentration may be selected to be higher than a target effective doping concentration for the power semiconductor devices 210 to ensure that variations in the amount of activated dopants do not result in the power semiconductor devices 210 having insufficient activated dopant levels in their JTE zones 232. In other words, the doping concentration in the implanted regions 234A, 234B, 234C, 234D, 234E may initially be set to a high level and then the effective doping concentration of the JTE zones 232 may be reduced from this level in subsequent steps of the fabrication process in order to reduce the effective doping concentration to a level that achieves a minimum breakdown voltage for the power semiconductor devices 210.

Once the wafer 200 of FIGS. 6 and 7 is formed and a dopant activation step such as an activation anneal has been performed, one or more of the power semiconductor devices 210 can be probed to measure, for example, an electrical characteristic thereof. For example, a first probe may be connected to the top-side contact 229 of a power semiconductor device 210 and a second probe may be connected to the bottom-side contact 228 of the power semiconductor device 210. A voltage potential may be placed across the power semiconductor device 210. An electrical characteristic of the power semiconductor device 210 such as, for example, the leakage current may be measured using the first and second probes. For example, in some embodiments, the voltage potential applied across the power semiconductor device 210 may be varied to determine a voltage potential at which the measured leakage current exceeds a certain level which is considered to represent reverse breakdown in order to determine the breakdown voltage of the power semiconductor device 210.

If the measured or estimated breakdown voltage of the device that is determined in the above-described probing step is too low (i.e., if the breakdown voltage is less than a specified or desired breakdown voltage), then a "trimming" step may be performed on the JTE zones 232 of the power semiconductor devices 210 on wafer 200. Herein, a "trimming" step refers to a process that reduces the number of activated dopants in one or more of a plurality of JTE zones of a JTE edge termination. Typically, the trimming step is performed by etching one or more of the implanted regions of the JTE zones, although it will be appreciated that other techniques may be used in other embodiments such as, for example, the implantation of opposite conductivity type dopants into the JTE zones.

Referring now to FIG. 8, one of the power semiconductor devices 210 of wafer 200 is pictured after a trimming step has been performed. As shown in FIG. 8, in one example trimming step, an upper portion of the middle of each implanted region 234A, 234B, 234C, 234D, 234E is removed via, for example, etching in order to reduce the size of each implanted region 234. In some embodiments, this removal step may be performed so that the relative doping concentrations of the JTE zones remains constant. For example, the same percentage of material may be removed from each implanted region 234 (e.g., ten percent of the total volume of each implanted region 234 is removed). By trimming each implanted region 234 in the above-described fashion, the amount of activated dopants in each JTE zone 232 is reduced.

After the above-described trimming step is performed, one or more of the power semiconductor devices 210 are again probed to measure an electrical characteristic of these devices such as the leakage current in order to determine if the leakage current is (or will be) at an acceptable level when, for example, a pre-specified breakdown voltage potential is applied across the power semiconductor device 210. If it is not, another trimming step may be performed, resulting in the device depicted in FIG. 9, where an additional portion of the upper middle of each implanted region 234 has been removed. Then, one or more of the power semiconductor devices 210 are again probed to measure an electrical characteristic of these devices such as the leakage current. If the measured leakage current indicates that the power semiconductor device 210 has at least a minimum desired breakdown voltage, then operations may cease, and the wafer 200 may be deemed acceptable. If not, additional trimming and probing steps may be performed until it is determined that the power semiconductor device 210 have at least the minimum desired breakdown voltage or until it is determined that the power semiconductor device 210 will not meet the minimum desired breakdown voltage.

The trimming steps in the above-described process according to embodiments of the present invention may be performed using traditional etching techniques. For example an etch mask may be formed on the wafer 200 using photolithography and then the implanted regions 234 may be etched via an isotropic etching step.

Currently, implanted JTE edge terminations may be formed using a calibration process in which the JTE zones of multiple power semiconductor devices (which devices can be on different wafers or on the same wafer) are implanted with different doses of dopants. For example, the implanted regions of the JTE zones (which implanted regions would decrease in size with increasing distance from the active region as discussed above with respect to FIG. 3 in order to provide a step-wise decreasing dopant profile) of a first group of power semiconductor devices on a wafer may be implanted with a dose of $1 \times 10^{14}$ boron atoms/cm$^2$, the JTE zones of a second group of power semiconductor devices on the wafer may be implanted with a dose of $2 \times 10^{14}$ boron atoms/cm$^2$, the JTE zones of a third group of power semiconductor devices on the wafer may be implanted with a dose of $3 \times 10^{14}$ boron atoms/cm$^2$, the JTE zones of a fourth group of power semiconductor devices on the wafer may be implanted with a dose of $4 \times 10^{14}$ boron atoms/cm$^2$, etc. The wafer that is formed in this fashion is sent through a complete or abbreviated fabrication run, and then the breakdown voltages of the power semiconductor devices are measured. The implantation dosage used with respect to the group of power semiconductor devices that achieved the highest average breakdown voltage (perhaps excluding any power semiconductor devices that appear to be defective) may then be selected as the implantation dosage to use for the JTE zones on all of the power semiconductor devices on subsequently fabricated wafers.

This approach may have certain disadvantages. First, in research and development processes, the design and/or fabrication parameters (e.g., doping levels, growth and annealing temperatures, photolithography and etching parameters and processes, etc.) of the power semiconductor devices may undergo almost constant change. This may also be true to a somewhat lesser extent with production processes, as semiconductor growth parameters may be changed on a routine basis even during production runs. When the design and/or fabrication parameters a power semiconductor device are changed significantly (e.g., the doping density of the drift region is changed), then the JTE implant process will typically need to be recalibrated, as the optimal ion implantation dosages for the JTE zones will typically vary with design changes. The same is true if the ion implantation conditions change (e.g., different implant temperature or energy, higher or lower dose rates, etc.) or the conditions for the dopant activation step (e.g., the anneal temperature). Growing and testing one or more calibration wafers every time that design or processing parameters change can add considerable expense and delay to an already expensive and time-consuming process. As high power semiconductor devices tend to be for limited production runs, the costs of fabricating calibration wafers may be cost prohibitive in some applications.

As discussed above, pursuant to embodiments of the present invention, the use of calibration wafers may be reduced or eliminated as the implanted regions of the JTE zones may be trimmed during the processing of the wafer so that each wafer may be self-calibrated during the fabrication process. This approach advantageously allows the calibration process to take into account and control for per-wafer differences in, for example, the doping of the drift region (and other regions of the device), which can impact the optimal dosages for the JTE zones. In practice, the per-wafer difference in the amount of activated dopants in the drift region (and other regions) of the device may vary by as much as 100% or more in the case of low-doped wafers for high power semiconductor devices. The calibration processes according to embodiments of the present invention may vary the doping levels of the JTE zones in a manner that takes into account the actual concentration of activated dopants in the drift region. Thus, pursuant to embodiments of the present invention, the process for calibrating the dosage of the JTE zones can be simplified and power semiconductor devices can be fabricated that have higher breakdown voltages. The in-process calibration techniques according to embodiments of the present invention may be applied on a per-wafer basis, on different groups of devices on a wafer (e.g., four groups of devices may be processed differently), or even on a per device basis. The ability to calibrate individual devices on a wafer or groups of devices on a wafer differently may be advantageous in some cases as semiconductor growth can differ across a wafer making optimum doping densities for the JTE zones potentially dependent on the location of the JTE edge termination on the wafer.

Figure 10:
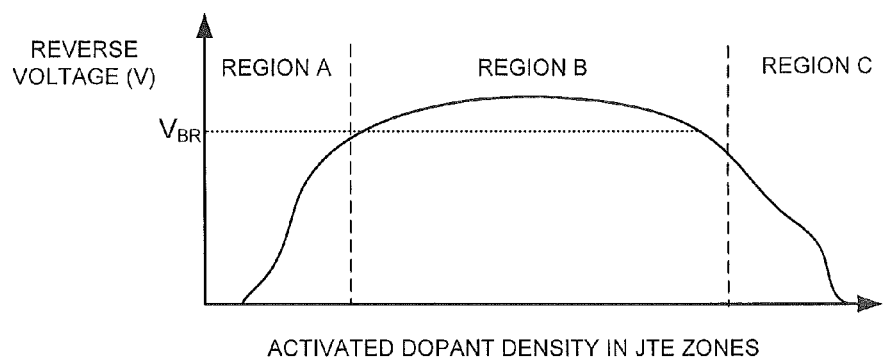
FIG. 10 is a graph that schematically illustrates the breakdown voltage of an example power semiconductor device as a function of the activated dopant density of the JTE zones of a JTE edge termination.

FIG. 10 is a graph that schematically illustrates the breakdown voltage of an example power semiconductor device as a function of the doping density of the implanted regions of a single-mask, multiple-zone JTE edge termination. As shown in FIG. 10, the number of activated dopants in the implanted regions of the JTE zones may have a significant impact on the breakdown voltage of the power semiconductor device. In particular, as shown in Region C of FIG. 10, if the activated dopant density is too high, then a conductive path is provided through the JTE zones and leakage current may increase significantly at higher reverse voltages. This can cause breakdown to occur at much lower voltages. As shown in FIG. 10, the curve between Region B and Region C is steep, indicating that once a critical activated dopant density is reached, even very small increases in the activated dopant density can lead to very large decreases in the breakdown voltage of the device.

The power semiconductor device also act similarly when the activated dopant density in the implanted regions of the JTE zones is too low. In particular, as shown in Region A of FIG. 10, if the activated dopant density is too low, then the JTE edge termination will not act sufficiently to mitigate electric field crowding at the edges of the active region, and hence the increased electric field that results when the activated dopant density is too low may also result in increased leakage currents that may significantly lower the reverse breakdown voltage of the device. As shown in FIG. 10, the curve between Region A and Region B is also steep, indicating that if the activated dopant density becomes too low, then even very small decreases in the activated dopant density in the implanted regions of the JTE zones can lead to very large decreases in the breakdown voltage of the device.

In contrast to the above-described transition regions, FIG. 10 shows that in Region B the breakdown voltage of the power semiconductor device may remain fairly constant over a fairly wide range of activated dopant densities. While the curve throughout much of Region B is relatively flat, it will be appreciated that the breakdown voltage may vary by, for example, hundreds of volts even in the center portion of Region B. Consequently, it may be advantageous in certain embodiments to identify an activated dopant density that provides a breakdown voltage that is at or near the maximum breakdown voltage.

As described above with reference to FIGS. 6-10, in some embodiments of the present invention, in-process wafer probing and trimming may be performed until the device achieves a minimum specified breakdown voltage. However, in other embodiments, additional probing may be performed in an effort to dope the power semiconductor device to a level that provides a breakdown voltage that exceeds the minimum specified breakdown voltage.

In particular, pursuant to further embodiments, the probing and trimming steps discussed above with reference to FIGS. 6-9 may be repeated one or more times after the probing step indicates that a minimum desired breakdown voltage has been achieved. By way of example, after some number of probing steps and trimming steps, it may be determined that the power semiconductor devices have achieved a minimum desired breakdown voltage. Once this determination is made, additional trimming and probing steps may be performed until it is determined that a trimming step resulted in a reduction in the breakdown voltages of the power semiconductor devices. Using this approach, it may be possible to manufacture power semiconductor devices that provide improved reverse breakdown performance. In some cases, the process may be further modified so that during each trimming step only a small number of the JTE edge terminations 230 on the wafer 200 are initially trimmed (e.g., between one and five). Then, a probing step is performed to see if this trimming improved or degraded the breakdown voltage. If the probing step indicates that the additional trimming step increased the breakdown voltage, then the remaining JTE edge terminations may be trimmed. If, however, the probing step indicates that the additional trimming step decreased the breakdown voltage, then the remaining JTE edge terminations are not trimmed further, and the process may end. In this manner, most of the JTE edge terminations may be trimmed an amount that may provide a breakdown voltage that is close to a maximum breakdown voltage for the device.

Figure 11:
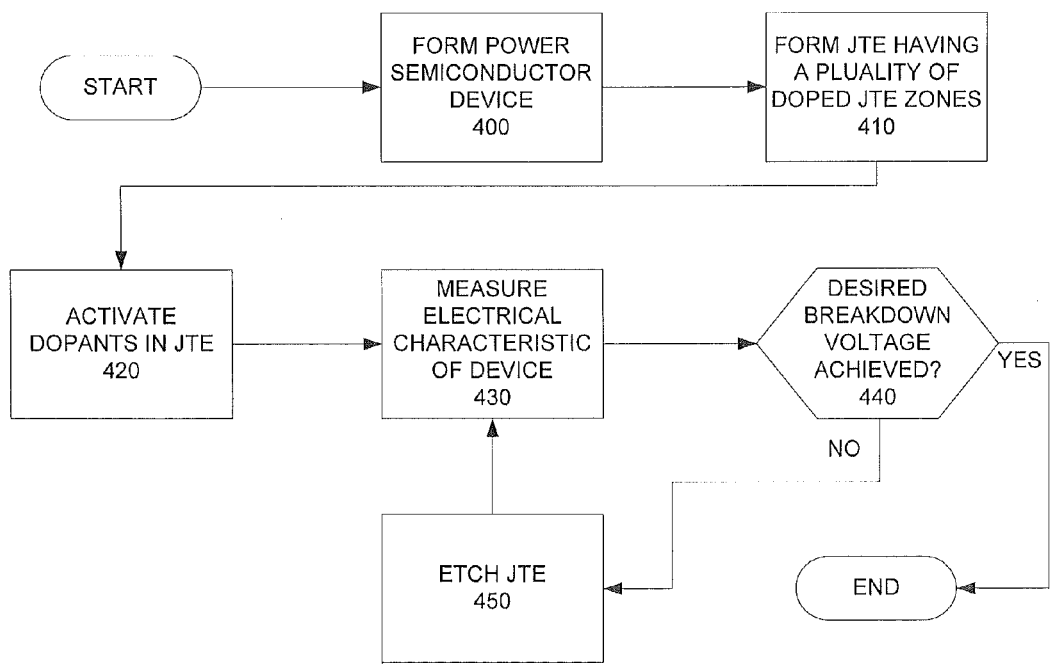
FIG. 11 is a flow chart that illustrates a method of improving the doping level of a JTE edge termination of a power semiconductor device according to embodiments of the present invention.

FIG. 11 is a flow chart that illustrates a general method of improving the doping level of a JTE edge termination of a power semiconductor device. As shown in FIG. 11, the method may start with the formation of at least one power semiconductor device on a wafer (block 400). The power semiconductor device may be formed on a substrate, and may have a drift region that has a first conductivity type. A JTE edge termination having a plurality of JTE zones that are doped with dopants having a second conductivity type may also be formed on the substrate adjacent the power semiconductor device (block 410). The junction termination zones may have different effective doping concentrations. The power semiconductor device and the JTE edge termination may be formed at the same time in some embodiments. A dopant activation process may be performed to activate at least some of the dopants having the second conductivity type in the junction termination zones (block 420). An electrical characteristic of the power semiconductor device may then be measured (block 430). Then, a determination may be made as to whether or not the power semiconductor device has achieved a desired reverse breakdown voltage (block 440). If it has, operations may end. If it has not, the JTE edge termination may be etched in order to reduce the effective doping concentration of dopants having the second conductivity type within the JTE edge termination (block 450). Operations may then return to block 430.

Figure 12:
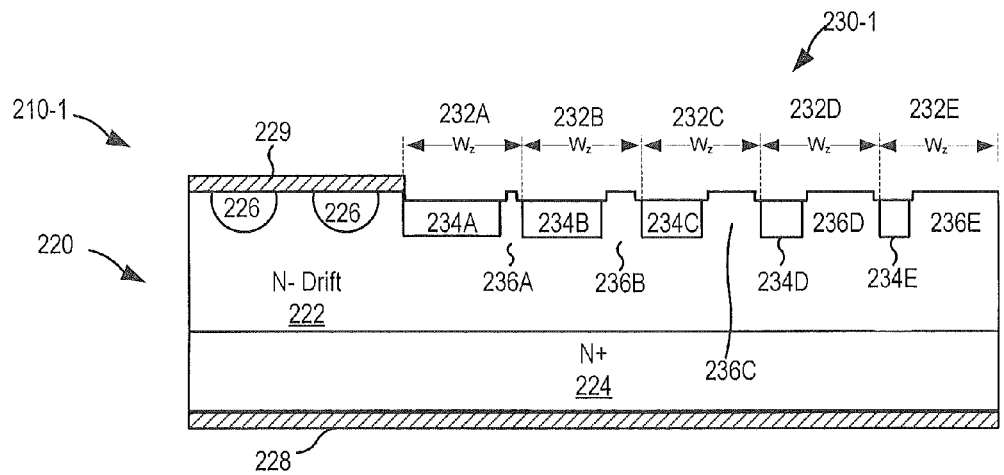
FIG. 12 is a cross-sectional diagram of a power semiconductor device having a JTE edge termination according to further embodiments of the present invention.

It will be appreciated that many additional modifications may be made to the above described embodiments without departing from the teachings of the present invention. By way of example, FIG. 12 is a cross-sectional diagram of a power semiconductor device 210-1 having a JTE edge termination 230-1 according to further embodiments of the present invention. As shown in FIG. 12, in this embodiment, during the trimming steps substantially the entirety of the implanted regions 234A, 234B, 234C, 234D, 234E may be etched, as may portions of the n-type regions 236A, 236B, 236C, 236D, 236E. Otherwise, the power semiconductor device 210-1 may be formed in the exact same manner as the power semiconductor device 210 that is described above.

Figure 13:
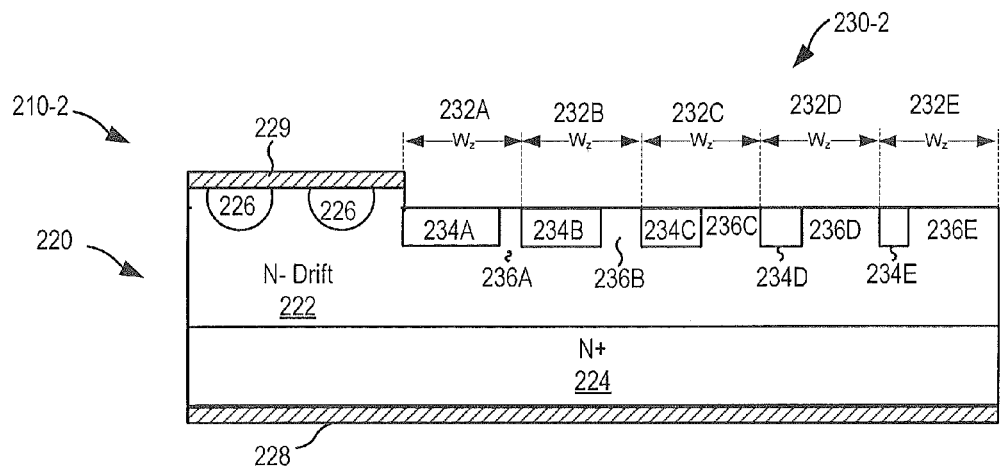
FIG. 13 is a cross-sectional diagram of a power semiconductor device having a JTE edge termination according to still further embodiments of the present invention.

As yet another example, FIG. 13 is a cross-sectional diagram of a power semiconductor device 210-2 having a JTE edge termination 230-2 according to still further embodiments of the present invention. As shown in FIG. 13, in this embodiment, substantially the entirety of the JTE zones 232A, 232B, 232C, 232D, 232E may be etched during the trimming steps. As a result, the active region 220 may be elevated on a mesa as compared to the JTE edge termination region 230-2. Since the implanted p-type regions 234A, 234B, 234C, 234D, 234E may be more heavily-doped than the n-type regions 236A, 236B, 236C, 236D, 236E and/or may, on average, be larger than the n-type regions 236A, 236B, 236C, 236D, 236E, the effect of this etching step may be to reduce the effective number of activated p-type dopants in the JTE edge termination 230. As shown in FIG. 13, in some embodiments, after the trimming steps are completed, a top surface of the JTE zones may be located between a top surface of the p+ regions 226 and a bottom surface of the p+ regions 226.

Figure 14:
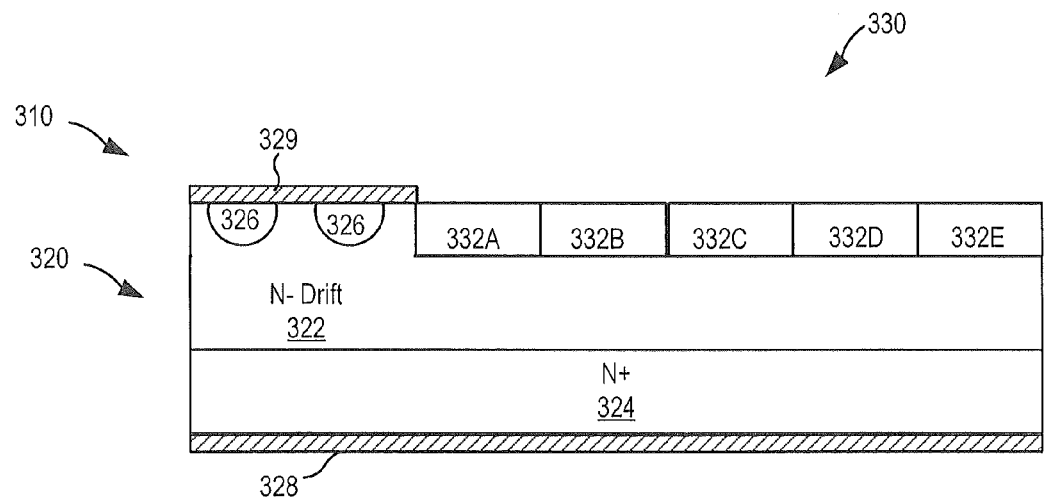
FIGS. 14 and 15 cross-sectional diagrams illustrating a method of forming a power semiconductor device having a JTE edge termination according to yet further embodiments of the present invention.
Figure 15:
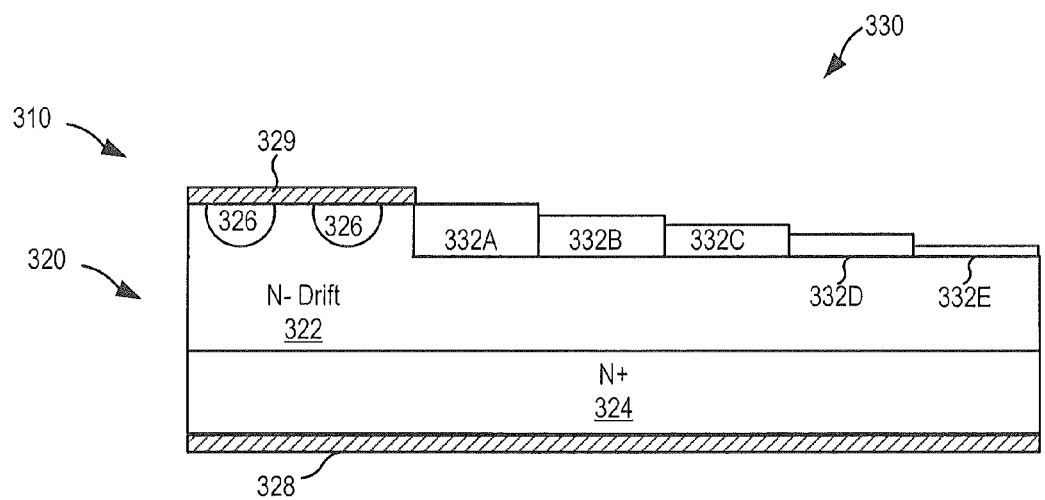

As shown in FIG. 14, pursuant to further embodiments, a power semiconductor device 310 that is similar to the power semiconductor device 10 of FIG. 2 may be formed. The power semiconductor device 310 includes a n+ substrate 324 and an n− drift region 322 in which an active region 320 and a JTE edge termination 330 are formed. The JTE edge termination 330 includes a plurality of JTE zones 332A, 332B, 332C, 332D, 332E, which are formed during a single ion implantation step and which each have substantially the same dopant density. As shown in FIG. 15, after the power semiconductor device 310 having uniformly-doped and uniformly-sized JTE zones 332 is formed, the JTE zones 332A, 332B, 332C, 332D, 332E are selectively etched to have decreasing concentrations of activated p-type dopants with increasing distance from the active region. In particular, as shown in FIG. 15, each JTE zone 332A, 332B, 332C, 332D, 332E is etched a different amount, with the JTE zones 332A, 332B, 332C, 332D, 332E that are farther from the active region 320 being etched a greater amount. Consequently, the relative heights of the JTE zones 332 provide a desired profile of decreasing dopant concentrations. Once the power semiconductor device 310 of FIG. 15 is formed, the methods according to embodiments of the present invention may be performed to probe and trim the JTE zones 332 further until the device 310 achieves a desired breakdown voltage. The JTE zones 332 may, for example, be etched a uniform amount during the trimming processes.

In the above described methods according to embodiments of the present invention, a series of probing and trimming steps may be performed. It will be appreciated that in the probing steps an electrical characteristic of the same power semiconductor device or devices may be measured each time or that the electrical characteristic of different power semiconductor devices may be measured each time or some of the times. It will also be appreciated that in many cases in each probing step at least several power semiconductor devices will be probed to provide more reliable results.

According to still further embodiments of the present invention, JTE edge terminations may be adjusted by processes other than trimming processes. For example, pursuant to embodiments of the present invention, instead of etching the JTE zones 234 in order to reduce the number of activated p-type dopants, n-type dopants may instead be implanted into the p-type regions 234 of the JTE zones 232 in order to reduce the effective doping level of the JTE zones 232.

Various embodiments of the present invention have been described above with reference to devices that have n-type substrates and drift regions and p-type implanted regions in the JTE zones. It will be appreciated, however, that the conductivity type of the various layers and regions may be reversed to provide opposite conductivity-type devices.

The above-described methods of forming JTE edge terminations according to embodiments of the present invention may be used in a wide variety of power semiconductor devices includes Schottky diodes, JBS diodes, diodes, MOSFETs, IGBTs, MOS-controlled thyristors, and other power semiconductor devices. Particular embodiments of the present invention provide edge termination structures for silicon carbide (SiC) devices. For example, embodiments of the present invention may be utilized as edge terminations for SiC Schottky diodes, JBS diodes, MPS diodes, MOSFETSs, IGBTs, MOS controlled thyristors, GTOs and other such SiC devices.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a power semiconductor device having an edge termination, the method comprising:
   forming the power semiconductor device on a substrate;
   forming a junction termination extension on the substrate adjacent the power semiconductor device, the junction termination extension including a plurality of junction termination zones that are doped with dopants, the junction termination zones having different effective doping concentrations;
   performing a dopant activation process to activate at least some of the dopants in the junction termination zones;

measuring an electrical characteristic of the power semiconductor device; and then etching the junction termination extension in order to reduce the effective doping concentration of dopants within the junction termination extension.

2. The method of claim 1, wherein the power semiconductor device has a drift region that has a first conductivity type, wherein the junction termination zones are doped with dopants having a second conductivity type that is different than the first conductivity type.

3. The method of claim 2, wherein the power semiconductor device comprises a first of a plurality of power semiconductor devices that are formed on the substrate, the method further comprising measuring an electrical characteristic of the first of the plurality of semiconductor devices or of a second of the plurality of power semiconductor devices after the etching of the junction termination extension is completed.

4. The method of claim 3, wherein forming the junction termination extension on the substrate adjacent the power semiconductor device, the junction termination extension including a plurality of junction termination zones that are doped with dopants having a second conductivity type that is different than the first conductivity type comprises doping the junction termination zones with effective doping concentrations of dopants having the second conductivity type that exceeds target effective doping concentrations for the junction termination zones.

5. The method of claim 2, wherein the measured electrical characteristic comprises a leakage current of the power semiconductor device.

6. The method of claim 2, wherein at least some of the plurality of junction termination zones comprise an implanted region in a top surface of the drift region that is adjacent to a non-implanted region in the top surface of the drift region, and wherein the effective doping concentration of each junction termination zone is greater than the effective doping concentration of others of the junction termination zones that are a greater distance from the power semiconductor device.

7. The method of claim 6, wherein a size of the implanted region of each junction termination zone is based on a distance of the junction termination zone from the power semiconductor device so that the size of the implanted region of each junction termination zone exceeds the sizes of the implanted regions of others of the junction termination zones that are at a greater distance from the power semiconductor device.

8. The method of claim 6, wherein etching the junction termination extension in order to reduce the effective doping concentration of dopants having the second conductivity type within the junction termination extension comprises etching both the implanted region and any non-implanted region of each junction termination zone.

9. The method of claim 6, wherein etching the junction termination extension in order to reduce the effective doping concentration of dopants having the second conductivity type within the junction termination extension comprises etching only the implanted regions of each junction termination zone.

10. The method of claim 2, wherein the dopant activation process comprises an activation anneal performed at a temperature of at least 1400° C.

11. The method of claim 1, wherein etching the junction termination extension increases a breakdown voltage of the power semiconductor device.

12. A method of forming an edge termination, the method comprising:

forming a junction termination extension on a substrate that includes a semiconductor layer thereon; and then performing a first probing operation on the substrate that includes the semiconductor layer and the junction termination extension to measure an electrical characteristic thereof;

removing at least a portion of the junction termination extension; and performing a second probing operation on the substrate with the semiconductor layer.

13. The method of claim 12, wherein the first probing operation and the second probing operation measure the same electrical characteristic.

14. The method of claim 13, wherein the electrical characteristic comprises a breakdown voltage or a leakage current.

15. The method of claim 12, wherein the junction termination extension includes a plurality of junction termination zones, and wherein removing at least a portion of the junction termination extension comprises etching an upper surface of at least a portion of each junction termination zone.

16. The method of claim 15, wherein the semiconductor layer has a first conductivity type and wherein forming the junction termination extension comprises implanting dopants having a second conductivity type that is opposite the first conductivity type into the semiconductor layer to form a plurality of implanted regions, and wherein each junction termination zone comprises one of the implanted regions and wherein at least some of the junction termination zones include a non-implanted region that is adjacent the implanted region of the junction termination zone.

17. The method of claim 16, wherein removing at least a portion of the junction termination extension comprises etching the junction termination zones to reduce the number of activated dopants in each junction termination zone by approximately the same percentage.

18. The method of claim 16, wherein removing at least a portion of the junction termination extension comprises etching both the implanted region and any non-implanted region of each junction termination zone.

19. The method of claim 12, wherein removing at least a portion of the junction termination extension increases a breakdown voltage of a power semiconductor device that is formed at least partially in the semiconductor layer.

20. A method of forming power semiconductor devices, the method comprising:

forming first and second power semiconductor devices on a substrate that has a semiconductor layer that has a first conductivity type thereon;

forming a first junction termination extension on the substrate adjacent the first power semiconductor device and forming a second junction termination extension on the substrate adjacent the second power semiconductor device, wherein each of the junction termination extensions includes a plurality of junction termination zones that are doped with dopants having a second conductivity type that is different than the first conductivity type, the junction termination zones having different effective doping concentrations of dopants having the second conductivity type;

performing a dopant activation process to activate at least some of the dopants having the second conductivity type in the junction termination zones;

measuring an electrical characteristic of the first power semiconductor device;

reducing the number of activated dopants having the second conductivity type in the first and second junction termination extensions after measuring the electrical characteristic of the first power semiconductor device; and then measuring the electrical characteristic of at least one of the first power semiconductor device or the second power semiconductor device.

21. The method of claim 20, wherein reducing the number of activated dopants having the second conductivity type in the first and second junction termination extensions comprises etching each of the junction termination zones in the first and second junction termination extensions to remove at least a portion of the top surface of each of the junction termination zones.

22. The method of claim 20, wherein reducing the number of activated dopants having the second conductivity type in the first and second junction termination extensions comprises implanting dopants having the first conductivity type into each of the junction termination zones in the first and second junction termination extensions and then performing a second dopant activation process to activate at least some of the dopants having the first conductivity type in the junction termination zones.

23. A power semiconductor device, comprising:
an active region that includes at least one power device that is formed in a semiconductor layer structure that includes at least a semiconductor layer having a first conductivity type and a region in an upper surface of the semiconductor layer that has a second conductivity type that is opposite the first conductivity type a junction termination extension adjacent to the active region, the junction termination extension including a plurality of junction termination zones in the semiconductor layer, wherein each junction termination zone comprises a junction termination region having the second conductivity type; and wherein a top surface of at least portions of some of the junction termination zones are recessed below a top surface of the semiconductor layer structure in the active region but are above a bottom surface of the region in the upper surface of the semiconductor layer that has a second conductivity type, wherein top surfaces of some of the junction termination zones are at different heights above a bottom surface of the semiconductor layer structure or first and second portions of a first of the junction termination zones have respective heights above the bottom surface of the semiconductor layer structure that are different.

24. The power semiconductor device of claim 23, wherein a top surface of each junction termination zone is at a different height above a bottom surface of the semiconductor layer structure.

25. The power semiconductor device of claim 23, wherein each of the junction termination zones has an uneven top surface.

* * * * *